United States Patent
Fjelstad et al.

(10) Patent No.: US 6,211,572 B1
(45) Date of Patent: Apr. 3, 2001

(54) SEMICONDUCTOR CHIP PACKAGE WITH FAN-IN LEADS

(75) Inventors: Joseph Fjelstad, Sunnyvale; Konstantine Karavakis, Pleasanton, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 08/739,303

(22) Filed: Oct. 29, 1996

Related U.S. Application Data

(60) Provisional application No. 60/007,128, filed on Oct. 31, 1995.

(51) Int. Cl.[7] ............ H01L 23/48; H01L 23/52; H01L 29/40
(52) U.S. Cl. .......... 257/781; 257/759; 257/776; 257/773
(58) Field of Search .................. 257/759, 642, 257/760, 780, 781, 777, 787, 773, 784, 776

(56) References Cited

U.S. PATENT DOCUMENTS

| | | | |
|---|---|---|---|
| 4,001,870 | * 1/1977 | Saiki et al. | 257/759 |
| 4,074,342 | * 2/1978 | Honn et al. | 257/777 |
| 4,365,264 | * 12/1982 | Mukai et al. | 257/759 |
| 4,618,878 | * 10/1986 | Aoyama et al. | 257/759 |
| 4,813,129 | 3/1989 | Karnezos . | |
| 4,885,126 | 12/1989 | Polonio . | |
| 4,902,606 | 2/1990 | Patraw . | |
| 5,072,520 | 12/1991 | Nelson . | |
| 5,148,265 | 9/1992 | Khandros et al. . | |
| 5,148,266 | * 9/1992 | Khandros et al. . | |
| 5,180,311 | 1/1993 | Schreiber et al. . | |
| 5,430,329 | * 7/1995 | Harada et al. | 257/642 |
| 5,455,390 | 10/1995 | DiStefano et al. . | |
| 5,489,749 | * 2/1996 | Distefano et al. . | |
| 5,491,302 | * 2/1996 | Distafano et al. . | |
| 5,604,380 | * 2/1997 | Nishimura et al. | 257/642 |
| 5,619,017 | * 4/1997 | Distafano et al. . | |
| 5,666,270 | 9/1997 | Matsuda et al. . | |
| 5,679,977 | 10/1997 | Khandros et al. . | |
| 5,749,997 | 5/1998 | Tang et al. . | |
| 5,777,379 | 7/1998 | Karavakis et al. | 257/668 |
| 5,874,782 | 2/1999 | Palagonia | 257/778 |

FOREIGN PATENT DOCUMENTS 62-18739 * 1/1987 (JP) ..................... 257/787

OTHER PUBLICATIONS

"Methods of Testing Chips and Joining Chips to Substrates," 2244 Research Disclosure, Feb. 1991, Elmsworth, GB, 32290.

* cited by examiner

*Primary Examiner*—Sheila V. Clark
(74) *Attorney, Agent, or Firm*—Lerner, David, Littenberg, Krumholz & Mentlik

(57) ABSTRACT

A compliant semiconductor chip package with fan-in leads and a method for manufacturing the same. The package, or "assembly", contains a multiplicity of bond ribbons connected between the contacts of a semiconductor chip and corresponding terminals on a top surface of a compliant layer. The compliant layer provides stress relief to the bond ribbons encountered during handling or affixing the assembly to an external substrate. The chip package also contains a dielectric layer adjacent to at least one end of the bond ribbons. The dielectric layer relieves mechanical stresses associated with the thermal mismatch of assembly and substrate materials during thermal cycling. The assembly can be manufactured without the need for any bond wiring tools since the bond ribbons are patterned and formed during a standard photolithographic stage within the manufacturing process. The manufacturing process is also amenable to simultaneous assembly of a multiplicity of undiced chips on a wafer or simultaneous assembly of diced chips in a processing boat.

21 Claims, 4 Drawing Sheets

SEMICONDUCTOR CHIP PACKAGE WITH FAN-IN LEADS

CROSS REFERENCE TO RELATED APPLICATIONS

The present application claims benefit of United States Provisional Application No. 60/007,128, filed Oct. 31, 1995.

FIELD OF THE INVENTION

The present invention relates to semiconductor chip packaging. More particularly, the present invention relates to an improved compliant semiconductor package structure and methods for making the same.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the chip is positioned on a substrate with a bottom or back surface of the chip abutting the substrate and with the contact-bearing front or top surface of the chip facing upwardly, away from the substrate. Individual gold or aluminum wires are connected between the contacts on the chip and pads on the substrate. In tape automated bonding a flexible dielectric tape with a prefabricated array of leads thereon is positioned over the chip and substrate and the individual leads are bonded to the contacts on the chip and to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the chip contacts and substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers". The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly most preferably includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This in turn provides very substantial economic and quality advantages.

Commonly owned U.S. Pat. No. 5,455,390 describes a further improvement. Components according to preferred embodiments of the '390 patent use a flexible, dielectric top sheet having top and bottom surfaces. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the chip so as to bring the lower ends of the leads into engagement with the contacts on the chip, and then subjecting the assembly to elevated temperature and pressure conditions. All of the lower ends of the leads bond to the contacts on the chip substantially simultaneously. The bonded leads connect the terminals of the top sheet with the contacts on the chip. The support layer desirably is either formed from a relatively low-modulus, compliant material, or else is removed and replaced after the lead bonding step with such a compliant material. In the finished assembly, the terminals desirably are movable with respect to the chip to permit testing and to compensate for thermal effects. However, the components and methods of the '390 patent provide further advantages, including the ability to make all of the bonds to the chip or other component in a single lamination-like process step. The components and methods of the '390 application are especially advantageous when used with chips or other microelectronic elements having contacts disposed in an area array.

Despite the positive results of the aforementioned commonly owned inventions, still further improvements would be desirable.

SUMMARY OF THE INVENTION

The present invention contemplates a method of creating a compliant semiconductor chip package assembly and the semiconductor chip package assembly created therefrom.

In the fabrication process first, a first dielectric protective layer is provided on a contact bearing surface of a semiconductor chip. The semiconductor chip has a central region bounded by the chip contacts and a set of apertures. The apertures in the dielectric protective layer are provided such that the chip contacts are exposed. This first dielectric protective layer may actually be the silicon dioxide passivation layer of the semiconductor chip.

Second, a compliant layer, preferably consisting of silicone, flexibilized epoxy, a thermosetting polymer or polyimide is provided atop the first dielectric protective layer is provided within the central region. The compliant layer is formed such that it has a substantially flat top surface and edges that gradually slope down to the top surface of the first dielectric protective layer. The sloping edges of the compliant layer may be manufactured to have a first transition region near the top surface of the compliant layer and a second transition region near the bottom surface of the compliant layer such that both the first transition region and the second transition region have a radius of curvature.

Finally, bond ribbons are selectively electroplated atop both the first dielectric protective layer and the compliant layer such that each bond ribbon electrically connects each chip contact to a respective terminal position on the compliant layer. The terminal positions are the conductive elements that connect the finished assembly to a separate substrate, e.g. a printed circuit board.

The method described above may further include the step of providing for a second dielectric protective layer atop the bond ribbons and the compliant layer after the bond ribbon electroplating step is performed. This optional second dielectric protective layer is fabricated with a set of apertures that expose the underlying terminal positions on the compliant layer.

Additionally, the method described above may further include the optional step of providing for an encapsulant layer above the bond ribbons. If this optional step is performed, it is performed after the step of selectively electroplating the bond ribbons. Like the first dielectric layer, the encapsulant layer is fabricated with a set of apertures so that the terminal positions are exposed. The encapsulant layer material consists preferably of either a curable liquid, such as silicone, a flexibilized epoxy or a gel. This optional step may also be performed just prior to the optional step of providing for a second dielectric protective layer.

The method above can be applied simultaneously to a multiplicity of undiced semiconductor chips on a wafer or an array of diced semiconductor chips arranged in an array to form a corresponding multiplicity of compliant semiconductor chip packages.

The present invention also claims the structure of a unique compliant semiconductor chip package having fan-in type leads. The compliant semiconductor chip package is comprised of (1) a semiconductor chip having a plurality of peripheral bonding pads on a face surface thereof and a central region bound by the peripheral bonding pads; (2) a first dielectric protective layer having a first surface, a second surface and apertures, wherein the first surface of the first dielectric layer is joined to the face surface of the semiconductor chip and the peripheral bonding pads are exposed through the apertures; (3) a compliant layer having a top surface and a bottom surface, wherein the bottom surface of the compliant layer is joined to the second surface of the first dielectric layer within the central region of the semiconductor chip package; and (4) a plurality of electrically conductive bond ribbons, each bond ribbon having a first end that electrically couples to a respective peripheral bonding pad of the semiconductor chip and a second end that joins to the top surface of the compliant layer to form a package terminal.

The package terminals of the completed package are configured in an array that has an area smaller than the area bound by the peripheral bonding pads on the face of the semiconductor chip. In other words, the package has fan-in leads that permits minimization of the overall package size.

For increased reliability, the compliant layer has sloped peripheral edges so that the overlying bond ribbons are curved rather than kinked.

The compliant semiconductor chip package may also have a compliant layer characterized by an array of bumped protrusions. The bumped protrusions support the overlying conductive terminal position ends of the bond ribbons and function as conductive balls that join to a substrate thus forming a ball grid array type interconnection. Alternate to the bumped protrusions, the compliant layer may have an array of concavities that are useful for placement of solder balls into each concavity. This arrangement is also useful for a ball grid array type interconnect.

The foregoing and other objects and advantages of the present invention will be better understood from the following Detailed Description of a Preferred Embodiment, taken together with the attached figures.

DETAILED DESCRIPTION OF A PREFERRED EMBODIMENT

FIGS. 1A–F illustrate a side view of the process of creating the compliant chip package of the present invention on the face surface of a single die, on the face surfaces of multiple die arranged in a coplanar array or on the face surface of an undiced silicon wafer which may be subsequently diced into individual packaged chips or multi-chip modules.

Figure 1A:
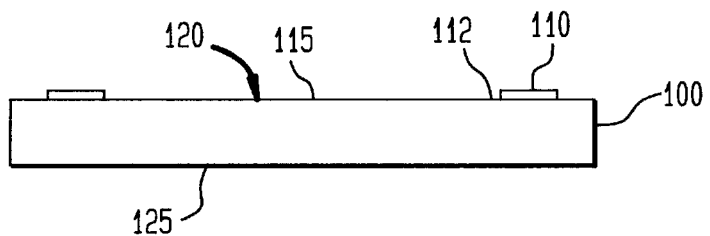
FIG. 1A is a cross-sectional view of a semiconductor chip assembly at the beginning of a fabrication process.
Figure 1B:
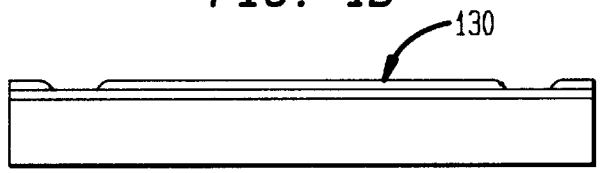
FIG. 1B is a cross-sectional view of the semiconductor chip assembly after a first step of the fabrication process, showing a deposited or laminated dielectric passivation layer.

FIG. 1A shows a single semiconductor chip 100 with a contact bearing face surface 120. The contacts 110 on the face surface 120 are typically aligned in a peripheral region 112 and further define a central region 115 therein. In FIG. 1B, a dielectric passivation layer is deposited or adhered onto the face surface 120 of the chip 100. The passivation layer may simply be the $SiO_2$ passivation layer (not shown) commonly found on the contact bearing surface of semiconductor chips, or a separate dielectric passivation layer 130 may be used, such as an epoxy resin, a polyimide resin, photo-imagable dielectric, etc. If the separate passivation layer 130 is used, the passivation layer 130 may be spun onto and built up to a planar sheet-like form on the face surface 120 or a dielectric sheet may be laminated to the face surface 120 using any of a number of electronic grade adhesives commonly known and used by those skilled in the art. The passivation layer 130 covers the face surface 120 of the chip 100 while leaving the chip contacts 110 exposed so that a bond ribbon may be plated thereon in a later step, as described below. Typically, this will be done by depositing or adhering the passivation layer 130 in a continuous sheet on the face surface 120 of the chip 100. A registering system, such as an automatic vision system, is used to locate the contacts 110. If a photo-imagable dielectric is used, the passivation layer 130 may be exposed and developed without exposing the area above the contacts 110, that unexposed area may then be removed. Another removal process which can be used is to use a pulse of directed energy, such as an excimer laser, to selectively remove the passivation layer 130 above the contacts 110. Alternately, a continuous dielectric sheet already having set contact holes may be registered and laminated to the chip 100.

Figure 1C:
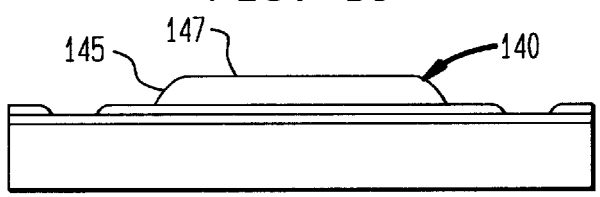
FIG. 1C is a cross-sectional view of the semiconductor chip assembly after a second step of the fabrication process, showing a deposited or laminated compliant layer within the central region of the semiconductor chip contact-bearing surface.

In the next step, as illustrated in FIG. 1C, a compliant layer 140 is deposited or laminated onto the exposed surface of the passivation layer 130. The compliant layer 140 may be stenciled, screened or transfer molded onto the passivation layer 130 using a curable liquid which, when cured, adheres to the passivation layer 130. Alternately, the compliant layer 140 may be adhered to the exposed surface of the passivation layer 130 in the form of cured compliant pads using the aforementioned electronic grade adhesives. The compliant layer 140 has a substantially flat top surface 147 which further typically has a gradual, sloping transition 145 between the face surface 120 of the chip 100 and the top surface 147. This transition 145 may follow a line of curvature from the passivation layer 130 to a substantially flat top surface 147 or may simply be canted at an angle such that the transition 145 is not too vertically oriented in relation to the passivation layer 130 and the top surface 147. The compliant layer 140 itself may be formed from a wide variety of materials; however, preferably, a low modulus of elasticity material is used as the compliant layer 140. Compliant interposers typically are fabricated from polymeric and other materials such as silicones, flexibilized epoxy, polyimides and other thermosetting polymers, fluoropolymers and thermoplastic polymers. Also, the interposer may be a composite incorporating plural materials. The interposer may consist of, or incorporate, a foam or mesh layer. The flexibility of the interposer depends on the thickness and configuration of the interposer, as well as on the properties of the materials used therein. Thus, a flexible interposer, capable of buckling or wrinkling to accommodate relative movement, can be fabricated from high elastic modulus materials, normally considered as "rigid" provided that these materials are present in thin layers. Relatively soft materials and foams can be used in greater thicknesses and still provide a highly flexible interposer. Moreover, such soft materials and foams provide a highly compliant interposer, i.e., an interposer which is readily compressible in the directions perpendicular its surfaces and which therefore permits movement of the terminals in these directions.

Figure 1D:
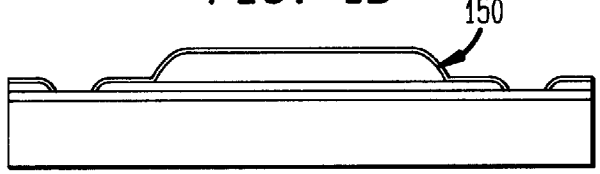
FIG. 1D is a cross-sectional view of the semiconductor chip assembly after a third step of the fabrication process, showing a conductive seed layer that has been sputtered over the assembly.
Figure 1E:
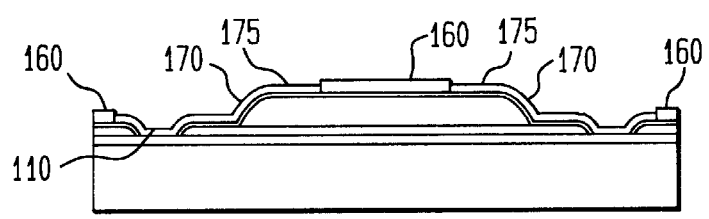
FIG. 1E is a cross-sectional view of the semiconductor chip assembly after a fourth step of the fabrication process, illustrating how after a photolithographic step conductive bond ribbons can be formed over the assembly.
Figure 2:
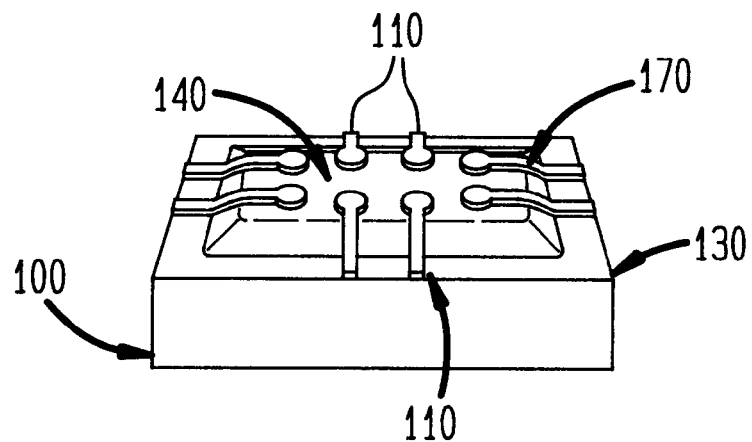
FIG. 2 is a perspective view of the semiconductor chip assembly after the bond ribbons have been formed over the compliant layer but before the second dielectric protective layer is coated.

A plating seed layer 150 is then deposited atop the aforementioned assembly, as shown in FIG. 1D, typically using a sputtering operation. Typical plating seed layer materials include palladium (for electroless plating), titanium, tungsten, nickel, chromium; however, primarily copper seed layers are used. FIG. 1E shows the next step in which photoresist 160 is applied to the exposed top surfaces of the assembly and then exposed and developed such that bond ribbons 170 may be plated within defined areas to form conductive paths electrically connecting the chip contacts 110 near a first end region of the ribbons 170 to terminals 175 comprising the second end region of the ribbons 170. This is perhaps more easily seen in the perspective view shown in FIG. 2. As shown, the ribbons 170 are plated directly onto the contacts 110 and extend in a "fan-in" arrangement from the peripheral region 112 to the central region 115 of the face surface 120 of the chip 100 atop the compliant layer 140. Possible bond ribbon materials include copper, gold, nickel, and alloys, combinations and composites thereof, among others. Since the bond ribbons 170 are plated directly onto the chip contact/compliant layer themselves, there is no need to develop a process for bonding the ribbons 170 to the contacts, as is necessary with most other approaches such as TAB, beam lead or wirebonding. This provides a significant cost savings because specialized thermocompression or ultrasonic bonders and their bonding tools need not be purchased or maintained. It is important, however, that the material selected for the bond ribbon 170 be compatible with the chip contact 110 material, which is typically aluminum. Otherwise, a phenomenon called Kirkendahl Voiding (voids created at the boundary of two metals having different interdiffusion coefficients) may cause voiding along the boundary of the two metals (ribbon/contact) leading to intermetallic degradation and embrittlement of the bond ribbon 170 itself making the lead/bond susceptible to failure during thermal cycling. Alternately, one or more barrier metals may be plated atop the chip contacts 110 prior to the bond ribbon plating step to thereby ensure the compatibility of materials.

Figure 1F:
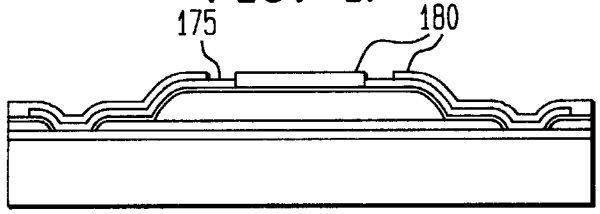
FIG. 1F is a cross-sectional view of the semiconductor chip assembly after a fifth step of the fabrication process, showing how the assembly is coated with a second dielectric protective layer.

As shown in FIG. 1F, preferably, a dielectric layer 180 is deposited or laminated over the top of the assembly so that only the terminals 175 are exposed. The dielectric layer may be comprised of a screened, exposed and developed or laminated sheet photo resist material or may be comprised of pyralene, epoxy resin, polyimide resin, fluoropolymer, etc. which is deposited or laminated on to the assembly, as described above in relation to the passivation layer 130. The terminals 175 may then be electrically connected to a circuitized substrate, such as a printed wiring board.

Typically, a solder ball or a solid-core solder ball will be used to create this electrical connection. The dielectric layer 180 is thus used as a solder mask to ensure that the solder does not electrically short between adjacent bond ribbons 170. Oxide layers and other surface contaminates typically build up on the surface of many types of metal (copper, nickel, etc.). Although not shown in FIG. 1F, the terminals 175 are typically flash plated with a thin layer of gold (approximately 0.25 to 0.5 microns) to inhibit the formation of these oxide layers. The gold layer is kept very thin so that it does not appreciably affect the aforementioned solder joint by dissolving into the solder to an amount which would embrittle the resulting solder joint between the terminal and a circuitized substrate.

The configuration of the above described chip package allows the package to mechanically decouple the chip 100 from an attached circuitized substrate (not shown). Typically, solder connections between the chip and the circuitized substrate are woefully inadequate to compensate for the thermal mismatch problem during temperature cycling of the chip. The combination of the compliant layer 140 and the flexible bond ribbons plated thereon allow the package to compensate for much of the TCE mismatch problem by giving limited movement of the terminals in the X, Y and Z directions with respect to the chip contacts 110 thereby minimizing the stress placed on the solder connections themselves, without imposing substantial forces on the bond between the ribbons 170 and the chip contacts 110. Further, because the compliant layer 140 is compressible, it also has the effect of compensating for any terminals 175 which are not perfectly planar with respect to its adjacent terminals when the terminals 175 are abutted against and coupled to the circuitized substrate. However, the top surface 147 of the compliant layer 140 should be made as flat and planar as possible so that the terminals 175 all lie in or near the same plane in order to minimize the amount of pressure needed to be placed on the bottom surface 125 of the chip 100 to ensure that all of the terminals/solder balls are electrically connected to a circuitized substrate.

Figure 3:
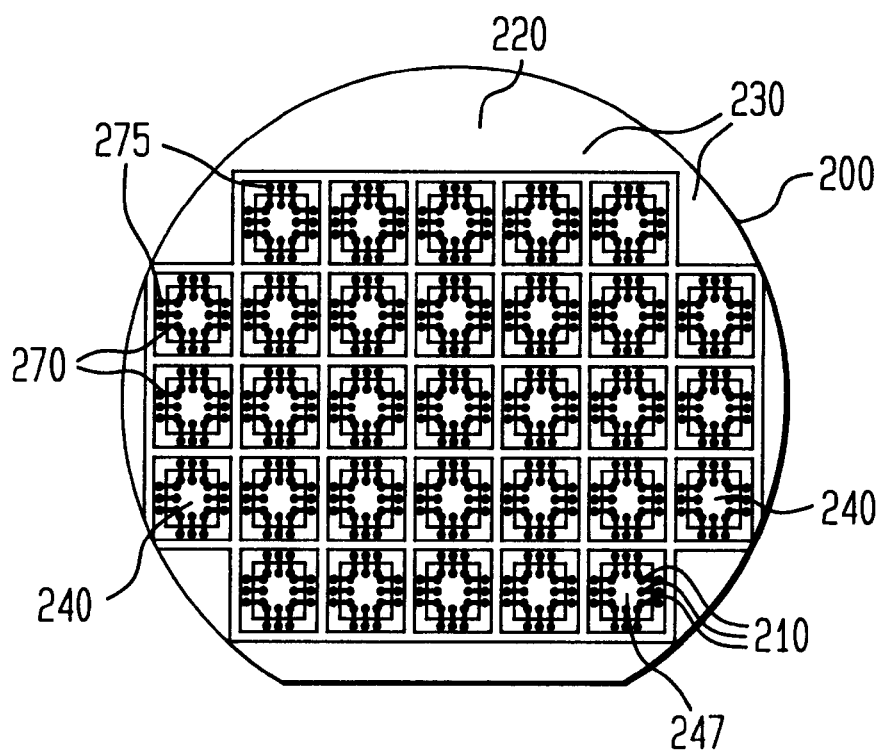
FIG. 3 is a plan view of a wafer having a multiplicity of semiconductor chips, illustrating how said multiplicity of semiconductor chips can be simultaneously packaged using the semiconductor chip assembly process depicted in FIGS. 1A–1F.

As illustrated in FIG. 3, the chip package described above in relation to FIGS. 1 and 2 may also be provided in the form of a multiplicity of packages on a wafer incorporating a plurality of individual, undiced chips, all of the same design or of differing designs. As shown, an array of individual passivation layers 230 may be deposited or laminated onto the face surface 220 of the wafer 200 leaving the chip contacts 210 of the various individual chips exposed, as described above. This arrangement is shown to better define the individual chips within the wafer. Preferably, however, a single passivation layer 230 is deposited or laminated onto the face surface 220 leaving the contacts 210 exposed. Individual compliant layers 240, as described above, are deposited or laminated onto the central regions of each of the individual chips within the wafer 200. The steps found in FIG. 1A–F are then performed, as described above, to create a plurality of connected individually packaged chips on the face surface 220 of the wafer 200. Each packaged chip having bond ribbons 270 which are connected at one end to contacts 210 and extending in to a central region of the respective chip in a fan-in fashion atop a respective compliant layer 240 and ending with a terminal 275 on the top surface 247 of the compliant layer 240. After the individual packages are completed, the individual chips may be separated from the wafer 200 and from one another, as by cutting the wafer 200 using conventional wafer severing or "dicing" equipment commonly utilized to sever wafers into individual chips. This procedure yields a plurality of packaged chip subassemblies, each of which may be secured to an individual circuitized substrate. Alternately, the chips may be separated from the wafer 200 in multi-chip arrangements of multiples of the same or different operational chips. The wafer level embodiment shown in FIG. 3 could be simulated using a panel of individual chips spaced apart from one another in a processing boat. The face surfaces of the individual chips would be coplanar with respect to one another to simulate the face surface 220 of the wafer 200. The chips above described steps would be performed and the chips would be separated if desired.

Figure 4:
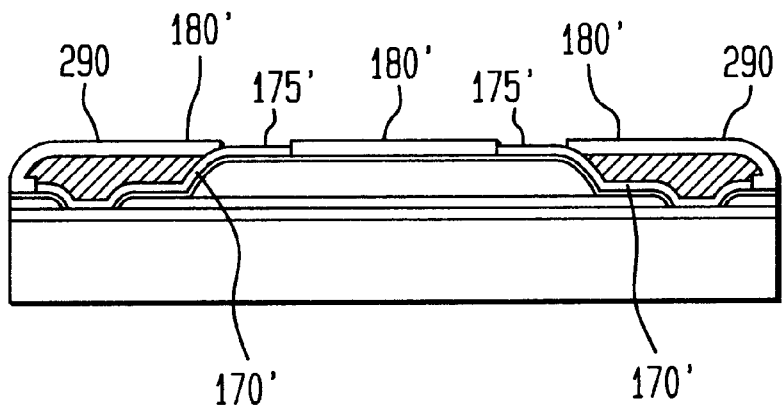
FIG. 4 is a cross-sectional view of an alternate embodiment of the present invention, illustrating the use of a low modulus encapsulant material to provide further support and stress relief to the bond ribbons.

In the alternate embodiment shown in FIG. 4, a low modulus encapsulant material 290 may be deposited around the exposed surfaces of the bond ribbons 170' leads prior to the step shown in FIG. 1F of depositing or laminating the assembly with the dielectric layer 180'. The encapsulant material 290 may have properties similar to those of rubber, gum or gel. Typical encapsulation materials include curable liquid or cured pads comprised of silicone, flexibilized epoxy, gels, thermoplastics, etc. If the encapsulant 290 is applied as a curable liquid, a fixture may be made such that the liquid flows around the bond ribbons 170' but does not flow on top of the terminals 175' to ensure that solder balls may be subsequently electrically connected to the terminals 175', as described above. Alternately, a machine such as a Camalot 1818 manufactured by Camalot Systems, Inc. of Havermill, Mass. may be used to flow the liquid encapsulant into the desired areas. After the liquid is deposited, it may be cured by any number of ways depending on the encapsulant material 290 used, e.g. heat, infrared energy, etc. The encapsulant 290 gives each of the bond ribbons 170' more support and further spreads some of the stress away from the ribbons 170' thus allowing a larger TCE mismatch between the chip and a circuitized substrate, as described above. After curing of the encapsulant 290, the dielectric layer 180' may be deposited or laminated thereto.

In another alternate embodiment, a conductive material such as beryllium copper, or a super plastic or shape memory alloy (such as Nitinol), is sputtered or otherwise deposited across the entire exposed surface of the chip/passivation layer/compliant layer (100/130/140) combination, shown in FIG. 1C. The conductive material may then be etched using industry standard photolithographic techniques resulting in a multiplicity of bond ribbons positioned and configured much like the bond ribbons 170 shown in FIG. 1E and FIG. 2. In this embodiment, as described above, a barrier metal, such as a flash plated layer of gold, may first be plated to the chip contacts to ensure compatibility of the electrical connection between the chip contact and the bond ribbon. Likewise, a flash plated layer of gold may be plated atop the exposed surface of the terminal. Also, the entire exposed surface of the bond ribbon could be plated with a thin layer of gold to increase the overall conductivity of such super plastic leads. A dielectric layer is next deposited or laminated as shown in FIG. 1F.

Figure 5A:
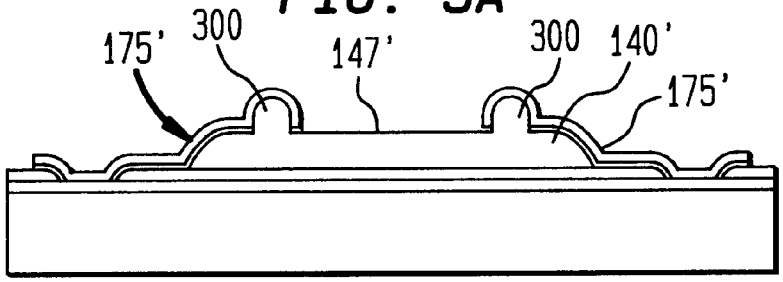
FIG. 5A is a cross-sectional view of an alternate embodiment of the present invention, illustrating the formation of bumped protrusions in the compliant layer that raise the overlying terminals such that the terminals form an array over the top surface of the compliant layer.
Figure 5B:
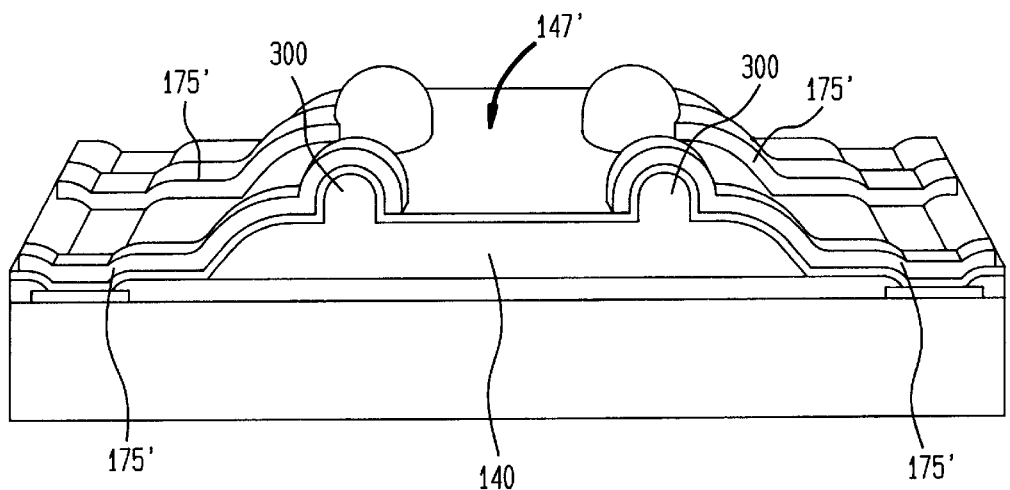
FIG. 5B is a perspective view of the embodiment shown in FIG. 5A.

FIG. 5A shows a side view and FIG. 5B a perspective view of another embodiment, according to the present invention. In this embodiment, the compliant layer 140' has protrusions 300 on its top surface 147'. These protrusions 300 may be integral with the compliant layer 140' or may be deposited or laminated onto the top surface 147' subsequent to the formation of the compliant layer 140'. The protrusions 300 may be formed of compliant, elastomeric material, such as the material comprising the compliant layer 140', or may be comprised of a semi-rigid or rigid material. The bond ribbon terminals 175' are plated on top of the protrusions 300 thereby providing raised surfaces which may be connected to a circuitized substrate. This technique allows for connection to such a substrate using less solder and without the need to accurately position solid-core solder balls.

Figure 6A:
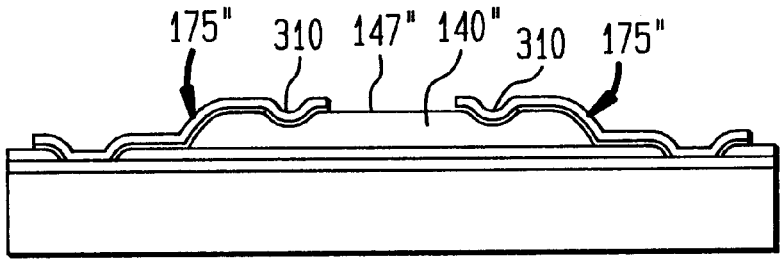
FIG. 6A is a cross-sectional view of an alternate embodiment of the present invention, illustrating the formation of concave areas in the compliant layer such that the overlying terminals have cup-like depressions useful for accurate placement of solder balls.
Figure 6B:
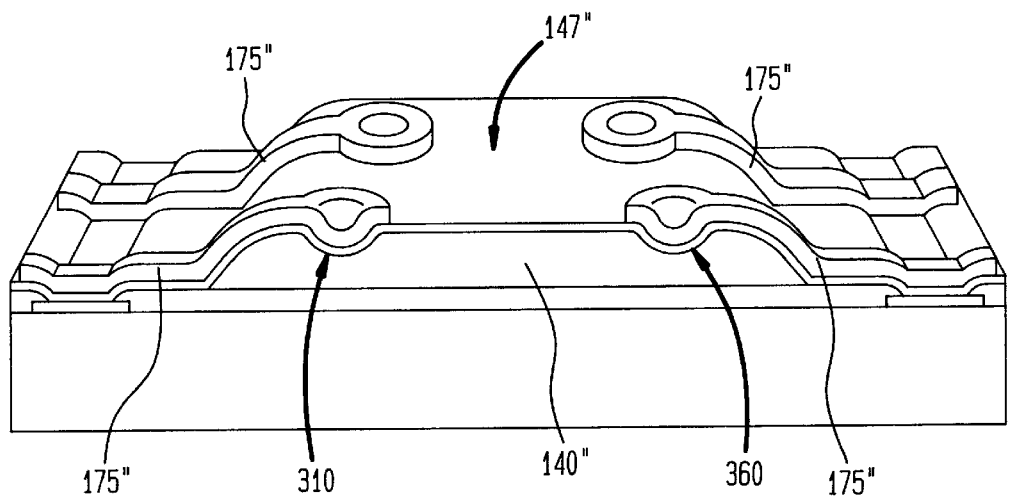
FIG. 6B is a perspective view of the embodiment shown in FIG. 6A.

FIG. 6A shows a side view and FIG. 6B a perspective view of another embodiment, according to the present invention. In this embodiment, concave areas 310 are created in the compliant layer 140". These concave areas 310 may be create in the formation of the compliant layer 140" or may be created subsequent to the formation of the compliant layer 140". The bond ribbon terminals 175" are plated within the concave areas 310 creating conductive "cup-like" areas on the top surface 147" of the compliant layer 140". Solder or solid-core solder balls are then placed within these areas 310 and reflowed to attach the package to a circuitized substrate, as described earlier. This technique allows for the accurate placement of solder or solid-core solder balls by allowing them to be deposited and retained within the cup-like areas.

As these and other variations and combinations of the features discussed above can be utilized without departing from the present invention as defined by the claims, the foregoing description of the preferred embodiments should be taken by way of illustration rather than by way of limitation of the invention set forth in the claims.

What is claimed is:

1. A compliant semiconductor chip package assembly comprising:
   a semiconductor chip having a plurality of peripheral chip contacts on a face surface thereof and a central region bounded by the peripheral chip contacts;
   a first dielectric protective layer having a first surface, a second surface and apertures, wherein the first surface of the first dielectric layer is attached to the face surface of the semiconductor chip and the apertures are aligned so that the chip contacts are exposed;
   a compliant layer having a top surface, a bottom surface and sloping peripheral edges, wherein the bottom surface of the compliant layer is joined to the second surface of the first dielectric layer within the central region of the semiconductor chip; and
   a plurality of electrically conductive bond ribbons, each bond ribbon having a top surface, a bottom surface, a first end that electrically couples to a respective peripheral chip contact of the semiconductor chip, wherein each bond ribbon extends along the sloping edges to the top surface of the compliant layer and connects to a respective terminal.

2. The compliant semiconductor chip package of claim 1 further including a second dielectric protective layer having a first surface that is attached to the exposed package assembly elements, wherein the second dielectric layer has a plurality of apertures such that the bonding pads of the semiconductor chip are exposed.

3. The compliant semiconductor chip package of claim 1 further comprised of an encapsulant layer that is attached to the top surface of the bond ribbons.

4. The compliant semiconductor chip package of claim 3 wherein the encapsulant layer material is selected from the group consisting of a curable liquid, silicone, flexibilized epoxy, thermoplastic and gel.

5. The compliant semiconductor chip package of claim 1 wherein the plurality of package terminals are configured in an array having an area that is smaller than the area bound by the peripheral bonding pads on the face of the semiconductor chip.

6. A compliant semiconductor chip package assembly comprising:
   a semiconductor chip having a plurality of peripheral chip contacts on a face surface thereof and a central region bounded by the peripheral chip contacts;
   a first dielectric protective layer having a first surface, a second surface and apertures, wherein the first surface of the first dielectric layer is attached to the face surface of the semiconductor chip and the apertures are aligned so that the chip contacts are exposed;
   a compliant layer having a top surface, a bottom surface and sloping peripheral edges, wherein the bottom surface of the compliant layer is joined to the second surface of the first dielectric layer within the central region of the semiconductor chip: and
   a plurality of electrically conductive bond ribbons, each bond ribbon having a top surface a bottom surface, a first end that electrically couples to a respective peripheral chip contact of the semiconductor chip, wherein each bond ribbon extends along the sloping edges to the top surface of the compliant layer and connects to a respective terminal, wherein the peripheral edge of the compliant layer has a first transition region near the top surface of the compliant layer and a second transition region near the second surface of the first dielectric protective layer and wherein the first and second transition regions have a radius of curvature.

7. The compliant semiconductor chip package of claim 1, wherein the compliant layer material is selected from the group consisting of silicone, flexibilized epoxy, a thermosetting polymer, fluoropolymer, thermoplastic polymer and polyimide.

8. The compliant semiconductor chip package of claim 1, wherein a plurality of bumped protrusions are provided and underly the plurality of package terminals such that an array of bumped package terminals is formed.

9. The compliant semiconductor chip package of claim 1, wherein the top surface of the compliant layer has a plurality of concavities underlying the plurality of package terminals such that an array of concave-like package terminals is formed.

10. A compliant microelectronic assembly comprising:
- a microelectronic element having a first surface and a plurality of contacts disposed on the first surface thereof;
- a compliant layer over the first surface of said microelectronic element, said compliant layer having a bottom surface facing toward said first surface of said microelectronic element, a top surface facing upwardly away from said microelectronic element and one or more edge surfaces extending between said top and bottom surface;
- conductive terminals overlying the top surface of said compliant layer; and
- flexible bond ribbons over said compliant layer, said bond ribbons extending over said top surface and extending on one or more of said edge surfaces, said bond ribbons electrically connecting said contacts and said conductive terminals.

11. The assembly as claimed in claim 10, where in said contacts on said microelectronic elements are disposed in a first region of said first surface, said compliant layer overlies a second region of said first surface, and said one or more of said edge surfaces include one or more border edge surfaces extending along one or more borders between said first and second regions.

12. The assembly as claimed in claim 10, further comprising:
- a first dielectric protective layer between the first surface of the microelectronic element have the compliant layer, the first dielectric layer having a plurality of apertures therein go that said contacts are accessible therethrough.

13. The assembly as claimed in claim 12, wherein said bond ribbons overlie said first dielectric protective layer and said compliant layer.

14. The assembly as claimed in claim 10, further comprising a dielectric cover layer over said compliant layer and said bond ribbons, wherein the dielectric cover layer has a plurality of apertures therein so that said terminals are accessible therethrough.

15. The assembly as claimed in claim 10, further comprising an encapsulant loyer over the exposed surface of the bond ribbons.

16. The assembly as claimed in claim 15, further comprising a second dielectric protective layer atop the encapsulant layer, wherein the second dielectric protective layer has a plurality of apertures therein so that said terminals are accessible therethrough.

17. The assembly as claimed in claim 10, further comprising a barrier metal atop one or more of the contacts.

18. The assembly as claimed in claim 10, wherein said microelectronic element, includes a plurality of undiced semiconductor chips on a wafer, said compliant layer including a plurality of regions, each said region overlying one said chip and having one or more of the conductive terminals connected to said chip.

19. The assembly as claimed in claim 10, wherein said microelectronic element includes a plurality of adjacent semiconductor chips arranged in an array to form a corresponding plurality of compliant semiconductor chip packages, said compliant layer including a plurality of regions, each said region overlying one said chip and having one or more of the conductive terminals connected to said chip.

20. The assembly as claimed in claim 10, wherein said edge surfaces of the compliant layer are sloping surfaces which extend in both vertical and horizontal directions.

21. A compliant microelectronic assembly comprising:
- a microelectronic element having a first surface and a plurality of contacts disposed on the first surface thereof;
- a compliant layer over the first surface of said microelectronic element, said compliant layer having a bottom surface facing toward said first surface of said microelectronic element, a top surface facing upwardly away from said microelectronic element and one or more edge surfaces extending between said top and bottom surface; conductive terminals overlying the top surface of said compliant layer; and
- flexible bond ribbons over said compliant layer, said bond ribbons extending over said top surface and extending on one or more of said edge surfaces, said bond ribbons electrically connecting said contacts and said conductive terminals,
- said edge surfaces of the compliant layer being sloping surfaces which extend in both vertical and horizontal directions,
- wherein at least some of said sloping edge surfaces have first transition regions near the top surface of the compliant layer and second transition regions near the bottom surface of the compliant layer, and wherein both the first and second transition regions have respective radii of curvature.

* * * * *

UNITED STATES PATENT AND TRADEMARK OFFICE
CERTIFICATE OF CORRECTION

PATENT NO. : 6,211,572 B1
DATED : April 3, 2001
INVENTOR(S) : Fjelstad et al.

It is certified that error appears in the above-identified patent and that said Letters Patent is hereby corrected as shown below:

Column 9,
Line 43, after the word "surface" insert -- , --.

Column 11,
Line 21, "where in" should read -- wherein --.
Line 30, "have" should read -- and. --
Line 32, "go" should read -- so --.
Line 43, "loyer" should read -- layer --.

Column 12,
Line 4, after the word "element" delete the comma.

Signed and Sealed this

Eleventh Day of December, 2001

Attest:

NICHOLAS P. GODICI
Attesting Officer  Acting Director of the United States Patent and Trademark Office